(12) United States Patent
Lan et al.

(10) Patent No.: US 7,112,512 B2
(45) Date of Patent: Sep. 26, 2006

(54) METHOD OF MANUFACTURING LIQUID CRYSTAL DISPLAY

(75) Inventors: Chih-Chieh Lan, Taipei (TW); Hung-Yi Hung, Sanchong (TW)

(73) Assignee: Hannstar Display Corporation, Taipei (TW)

( * ) Notice: Subject to any disclaimer, the term of this patent is extended or adjusted under 35 U.S.C. 154(b) by 136 days.

(21) Appl. No.: 10/868,908

(22) Filed: Jun. 15, 2004

(65) Prior Publication Data

US 2005/0112790 A1　May 26, 2005

(30) Foreign Application Priority Data

Nov. 26, 2003　(TW) ............... 92133243 A

(51) Int. Cl.
*H01L 21/76* (2006.01)
*H01L 21/00* (2006.01)

(52) U.S. Cl. ............ 438/430; 438/30; 438/149; 438/151; 438/158; 438/161; 438/42; 438/43; 349/42; 349/43; 349/46; 349/122; 349/138; 257/E21.166

(58) Field of Classification Search ........ 438/430, 438/149, 151, 158, 161, 30, 40, 42–43; 257/57, 257/59; 349/122, 138, 42, 43, 46
See application file for complete search history.

(56) References Cited

U.S. PATENT DOCUMENTS 5,883,682 A * 3/1999 Kim et al. ............ 349/43
6,376,288 B1 * 4/2002 Jen et al. ............ 438/158
2002/0130324 A1 * 9/2002 Song et al. ............ 257/72
2003/0122985 A1 * 7/2003 Park et al. ............ 349/43

* cited by examiner

*Primary Examiner*—Wael Fammy
*Assistant Examiner*—Mohsen Ahmadi
(74) *Attorney, Agent, or Firm*—Egbert Law Offices

(57) ABSTRACT

On a substrate, the pattern of the first conductive layer is defined, that is, a gate line combination including gate pads, scanning lines and gate electrodes. A gate insulating layer, a semiconductor layer, a doped semiconductor layer and a second conductive layer are deposited on the substrate and the above-mentioned gate line combination in sequence. A photoresist layer is overlaid on the second conductive layer. The photoresist layer within the aperture areas is fully exposed. Using a half-tone mask or a slit pattern to make parts of the photoresist layer lying on the gate pads and the gate electrodes are not exposed to its full depth. As a result, the photoresist pattern formed varies in thickness. After being processed with drying etching and wet etching for several times, all the layers previously deposited within the aperture areas can be totally etched and removed. However, as regards the layers deposited on the gate pads and the gate electrodes, etching only takes place in those layers above the semiconductor layer. Then, an organic protection layer is laid on the substrate and the above-mentioned structure, and the holes, which are to function as the passageways for the transparent conductive layer to contact the metallic layer, are defined on the organic protection layer. Then, the gate pads are exposed out of holes above them, using dry etching again. Lastly, the pattern of the transparent conductive layer is defined on the organic protection layer and in the plurality of holes.

17 Claims, 14 Drawing Sheets

METHOD OF MANUFACTURING LIQUID CRYSTAL DISPLAY

BACKGROUND OF THE INVENTION

1. Field of the Invention

The present invention relates to a method of manufacturing liquid crystal displays, and more particularly, to a method for the planarization manufacturing of a high-transmittance liquid crystal display.

2. Description of the Related Art

There is an ever-increasing luminance requirement for products related to a liquid crystal display (LCD) available on the market, such as a desktop LCD, a notebook LCD, and an LCD TV. In order to meet the high-luminance requirement, LCD panel manufacturers envision an increase in the aperture ratio of LCD panels and the light transmittance of aperture areas in the hope of increasing the overall transmittance rate of LCD panels, but they are reluctant to pursue the goal at the expense of power consumption.

As regards the manufacturing processes and patents intended for high aperture ratios as put forth by TFT-LCD manufacturers in Japan and South Korea, they essentially involve overlapping data lines with transparent electrodes (a layer of Indium Tin Oxide, ITO), with the addition of an organic planarization layer on the upper surface after a passivation layer SiNx is done.

FIG. 1 is a schematic diagram about parts of a circuit for an active substrate disclosed by the specification of U.S. Pat. No. 5,883,682. On a substrate 111, there are a plurality of pixels 112 disposed at the intersections of a plurality of scanning lines (or gate lines) 115 and data lines 135. Furthermore, a gate pad 117 and a data pad (or a source pad) 137 are formed at one end of each scanning line 115 and each data line 135 respectively. Various driving devices are connected to the gate pads 117 and the data pads 137.

FIGS. 2(a)–2(e) are schematic diagrams about the steps of the manufacturing process for the cross-sectional structure taken along the line II—II in FIG. 1. As shown in FIG. 2(a), a conductive layer is formed first, and patterns of the gate pads 117, the scanning lines 115 and the gate electrodes 113 are defined on the substrate 111 in the photo-lithography process 1 (PEP1). A gate insulating layer 119, a semiconductor layer 121, a doped semiconductor layer 123 and a second conductive layer are overlaid on the combination of the substrate 111, the gate pads 117, the scanning lines 115 and the gate electrodes 113 respectively, overlapping each other. Then, during the photo-lithography process 2 (PEP2), patterns of the source electrodes 133, the drain electrodes 143, the data lines 135 and the data pads 137 are defined, and parts of the doped semiconductor layer 123 are removed in the light of the aforesaid patterns (as shown in FIG. 2(b)).

Although the gate insulating layer 119 is a transparent film made from materials like silicon nitrides ($SiN_x$) and silicon oxides ($SiO_y$), it reflects light and absorbs light energy. Hence, it is necessary to calculate and control the thickness of the film in order to ensure an optimal light transmittance.

As shown in FIG. 2(c), during the photo-lithography process 3 (PEP3), both the gate insulating layer 119 and the semiconductor layer 121 in the aperture areas are removed, but part of the semiconductor layer 121 around the gate electrodes 113 is kept in order to treat it as the channel for the thin film transistors 114, and at this point the gate pads 117 are totally exposed. Parts of the doped semiconductor layer 123, the semiconductor layer 121 and the gate insulating layer 119 are still found beneath the data pads 137.

An organic passivation layer 139 is deposited on the thin film transistors 114, the gate pads 117 and the data pads 137. Then, the photo-lithography process 4 (PEP4) is succeeding, and the through holes 161, 163 and 165 are disposed on the surface of the organic passivation layer 139, as shown in FIG. 2(d). The holes 161, 163 and 165 allow the drain electrodes 143, the gate pads 117 and the data pads 137 to be exposed out of the organic passivation layer 139.

Then, a transparent conductive layer is deposited on the organic passivation layer 139 and the holes 161, 163 and 165. During the photo-lithography process 5 (PEP5), the transparent conductive layer is patterned upon the mask, and the pixel electrodes 153, the gate pad terminals 157 and the pad terminals 177 are formed respectively.

The above described liquid crystal display requires at least one additional photo-lithography step for removing the gate insulating layer. Therefore, there is an urgent demand on the market for a manufacturing method that can save at least one photo-lithography process so as to produce a liquid crystal display with great competitiveness.

SUMMARY OF THE INVENTION

An objective of the present invention is to provide a method of manufacturing a liquid crystal display with a high aperture ratio. Because the aperture areas are not covered with any gate insulating layer or any inorganic passivation layer, the light transmittance of the liquid crystal display increases so as to enhance the brightness of the images displayed on the screens.

To achieve the objective, the present invention discloses a method of manufacturing a liquid crystal display. On a substrate, the pattern of the first conductive layer is defined, that is, a gate line combination, including gate pads, scanning lines and gate electrodes. A gate insulating layer, a semiconductor layer, a doped semiconductor layer and a second conductive layer are deposited on the substrate and the above-mentioned gate line combination in sequence. A photoresist layer is overlaid on the second conductive layer. The photoresist layer within the aperture areas is fully exposed. Using a half-tone mask or a slit pattern to make parts of the photoresist layer lying on the gate pads and the gate electrodes are not exposed to its full depth. As a result, the photoresist pattern formed varies in thickness. After being processed with dry etching and wet etching, all the layers previously deposited within the aperture areas can be totally etched and removed. However, as regards the layers deposited on the gate pads and the gate electrodes, etching only takes place in the layers above the semiconductor layer. Then, an organic protection layer is laid on the substrate and the above-mentioned structure, and the holes, which are to function as the passageways for the transparent conductive layer to contact the metallic layer, are defined on the organic protection layer. Thus, the gate pads are exposed out of holes above them. Lastly, the pattern of the transparent conductive layer is defined on the organic protection layer and in the plurality of holes.

The present invention further discloses a method of manufacturing a liquid crystal display. On a substrate, the pattern of the first conductive layer is defined, forming a gate line combination that includes gate pads, scanning lines and gate electrodes. A gate insulating layer and a semiconductor layer are deposited on the substrate and the above-mentioned gate line combination in sequence. An etching stop is defined on the gate electrodes. Then, a doped semiconductor layer is deposited, and a pattern of a second conductive layer is defined. The gate insulating layer, the semiconductor layer and the doped semiconductor layer disposed on the gate pads and within the aperture areas are removed during an succeeding etching step as they are not covered with the second conductive layer. However, parts of them that are not susceptible to etching remain over the gate electrode areas to a certain depth because the thickness of the etching stop is greater than the total thickness of the removed layers. Then, an organic passivation layer is overlaid on the transparent substrate and the above-mentioned structure, and through holes, which are to function as the passageways for the transparent conductive layer to contact the metallic layer are defined on the organic passivation layer. Thus, the gate pads are exposed out of holes above them. Lastly, the pattern of the transparent conductive layer is defined on the surface of the organic passivation layer and in the plurality of holes.

If regardless of the thickness of the etching stop layer greater than the sum of the thickness of the gate insulating layer and the thickness of the semiconductor layer, it is feasible to remove the three layers disposed on the gate pads and within the aperture areas of the pixels by means of an additional photo-lithography process, and there is the alternative of removing the gate insulating layer disposed on the gate pads and within the pixel aperture areas by etching after the gate insulating layer was deposited.

BRIEF DESCRIPTION OF THE DRAWINGS

The invention will be described according to the appended drawings in which.

PREFERRED EMBODIMENT OF THE PRESENT INVENTION

Figure 1:
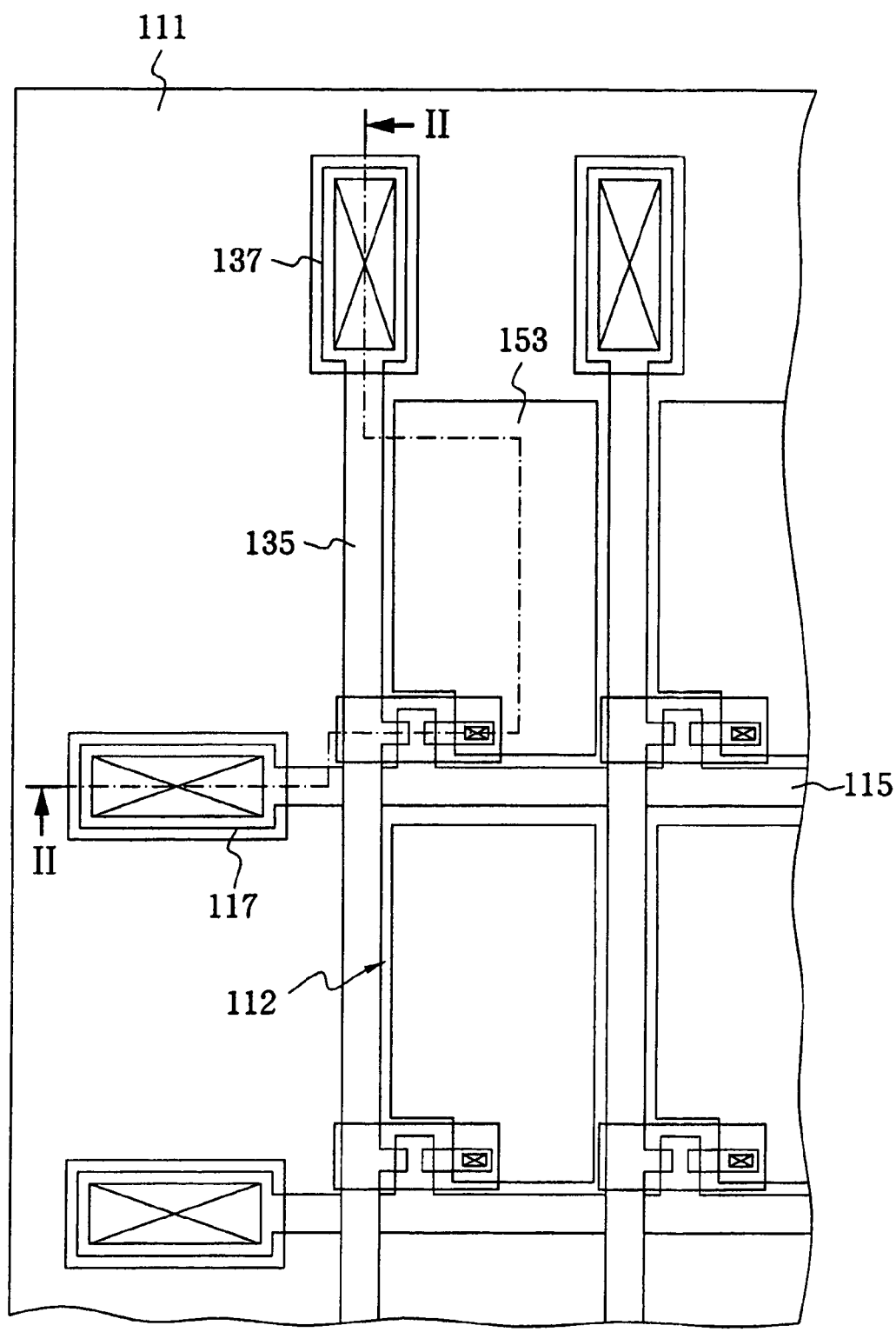
FIG. 1 is a schematic diagram about parts of a circuit for an active substrate disclosed by the specification of U.S. Pat. No. 5,883,682.
Figure 2A:
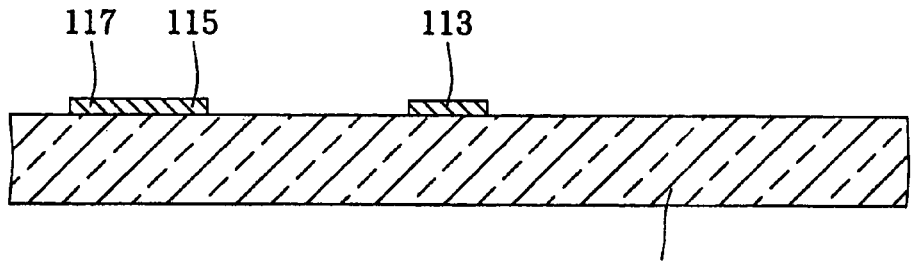
FIGS. 2(a)–2(e) are schematic diagrams about the steps of the manufacturing process for the cross-sectional structure taken along the line II—II in FIG. 1.
Figure 2B:
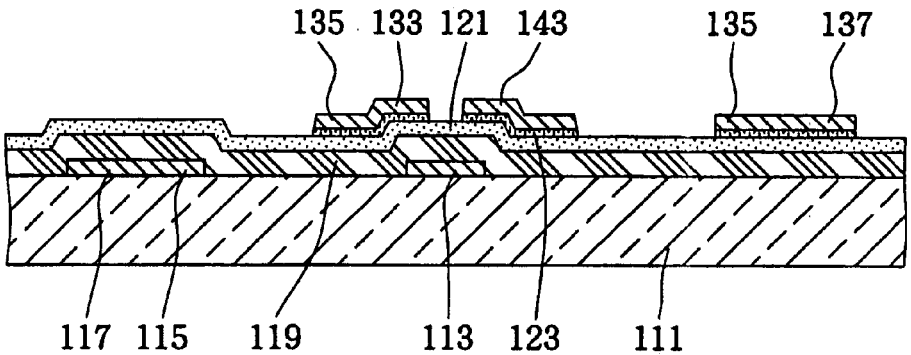
Figure 2C:
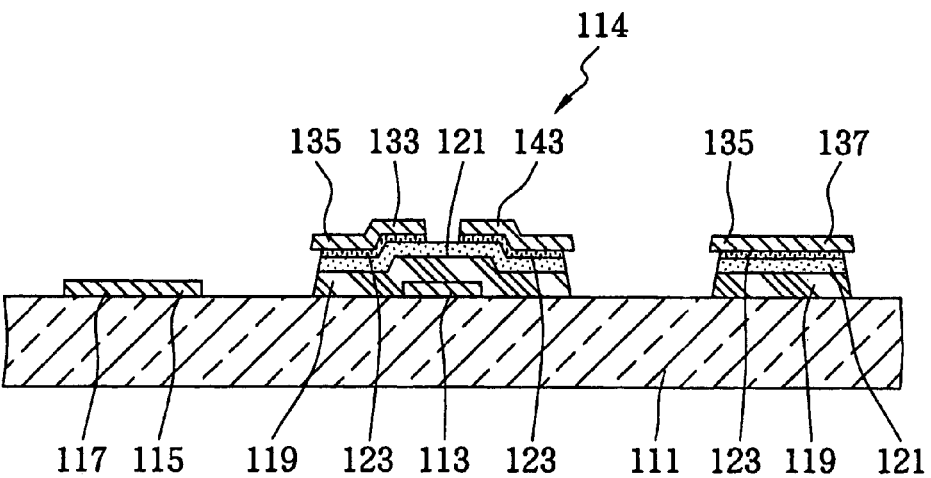
Figure 2D:
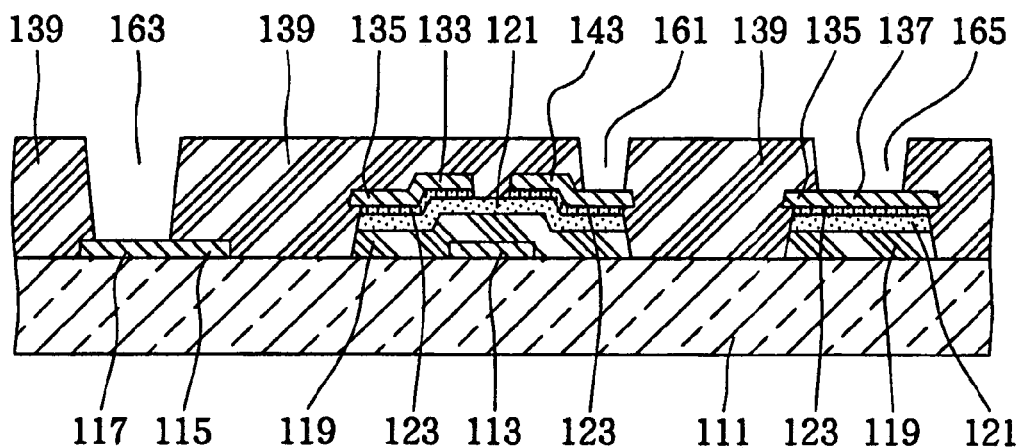
Figure 2E:
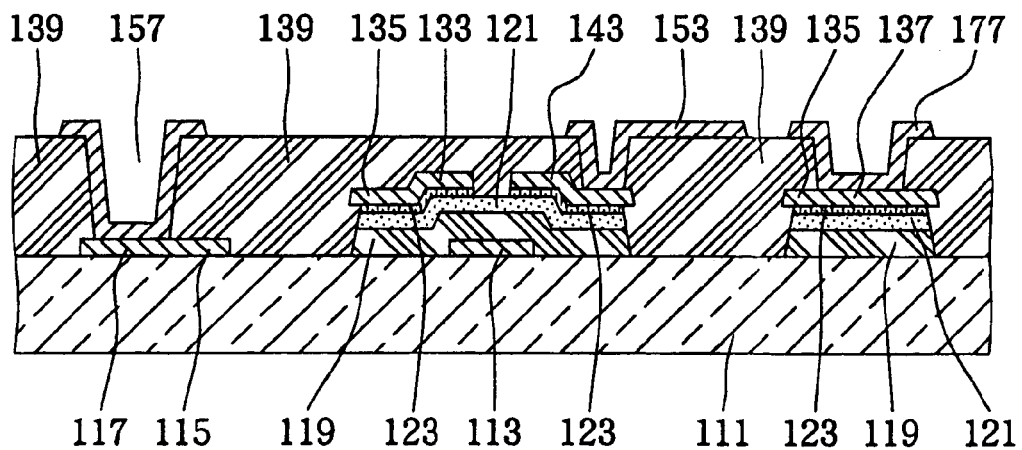
Figure 3:
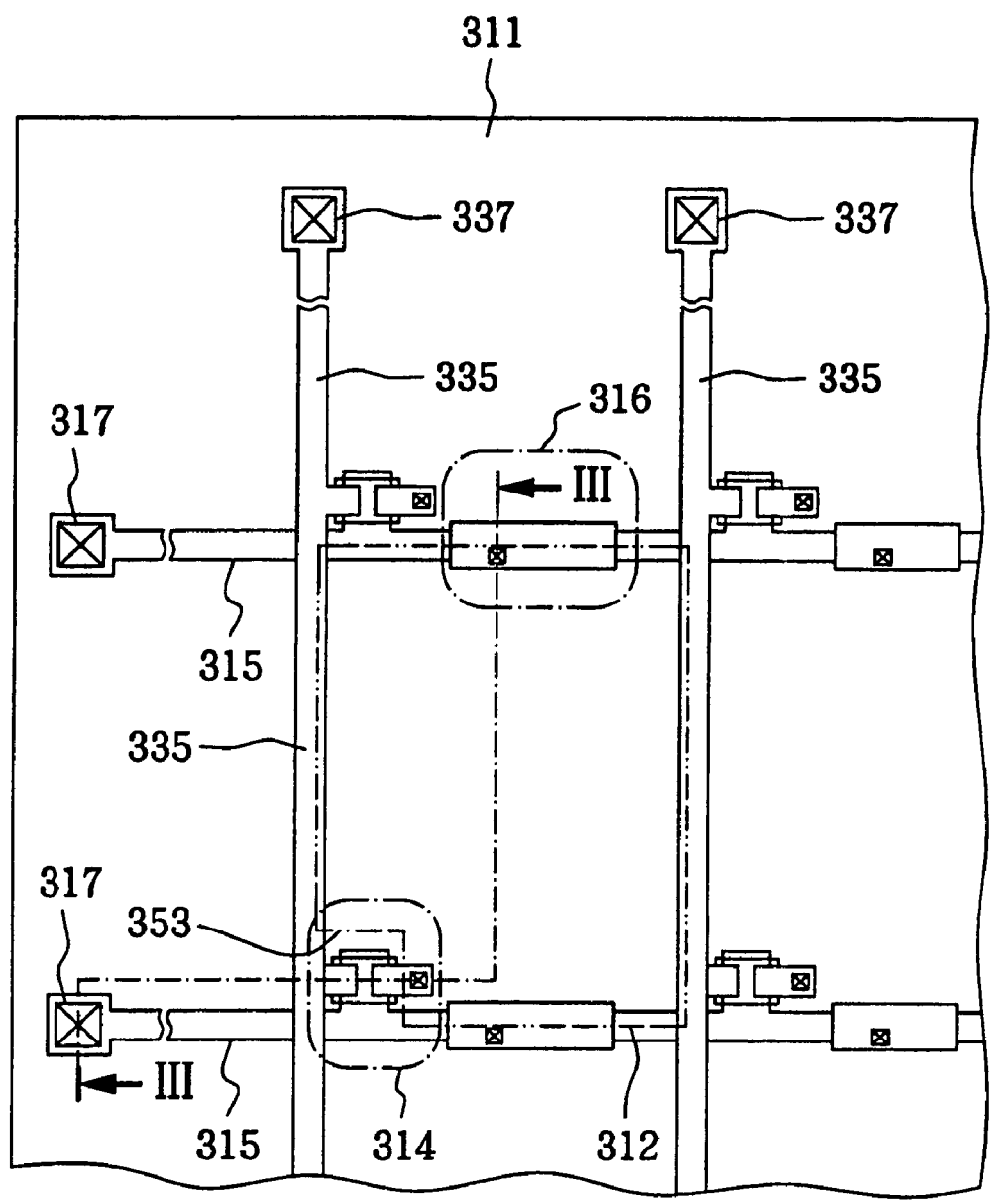
FIG. 3 is a schematic diagram of the partial circuit of an active substrate in accordance with the present invention.

FIG. 3 is a schematic diagram of the partial circuit of an active substrate in accordance with the present invention. On a substrate 311 are a plurality of pixels 312 disposed at the intersections of the scanning lines 315 and the data lines 335. A gate pad 317 and a data pad 337 are formed at one end of each scanning line 315 and each data line 335 respectively. Various driving devices are connected to the gate pads 317 and the data pads 337. Inside each pixel 312 is a thin film transistor 314 which controls. Signal voltages of the data lines 335 may be written into the pixel electrodes 353 through the scanning lines 315. To prevent the voltages written into the pixel electrodes 353 from attenuating excessively with time, a storage capacitor 316 is formed either between a scanning line 315 and a pixel electrode 353 or between a scanning line 315 and a common electrode.

Figure 4A:
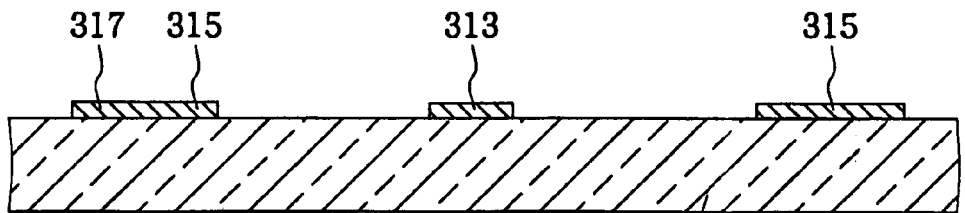
FIGS. 4(a)–4(e) are cross-sectional diagrams taken along the line III—III, regarding the steps of the manufacturing process for the cross-sectional structure depicted in FIG. 3.

FIGS. 4(a)–4(e) are cross-sectional diagrams taken along the line III—III, regarding the steps of the manufacturing process for the cross-sectional structure depicted in FIG. 3; wherein the steps about the formation of the gate pads 317, the thin film transistors 314 and the storage capacitors 316 are shown in the left hand side, the middle and the right hand side, respectively. As shown in FIG. 4(a), during a photo-lithography process, the pattern of the first conductive layer is defined on a substrate 311, forming a gate line combination that includes gate pads 317, scanning lines 315 and gate electrodes 313. The first conductive layer is made from materials like chromium, molybdenum, tantalum, tantalum molybdate, tungsten molybdate, aluminum, aluminum neodymate, copper, etc. Afterward, overlapping each other, a gate insulating layer 319, a semiconductor layer 321, a doped semiconductor layer 323 and a second conductive layer 325 are deposited on the substrate 311 and the above-mentioned structure respectively. The gate insulating layer 319 can be a transparent film made from a single material or multi-stacked materials like silicon nitrides, silicon oxides, and so on.

Figure 4B:
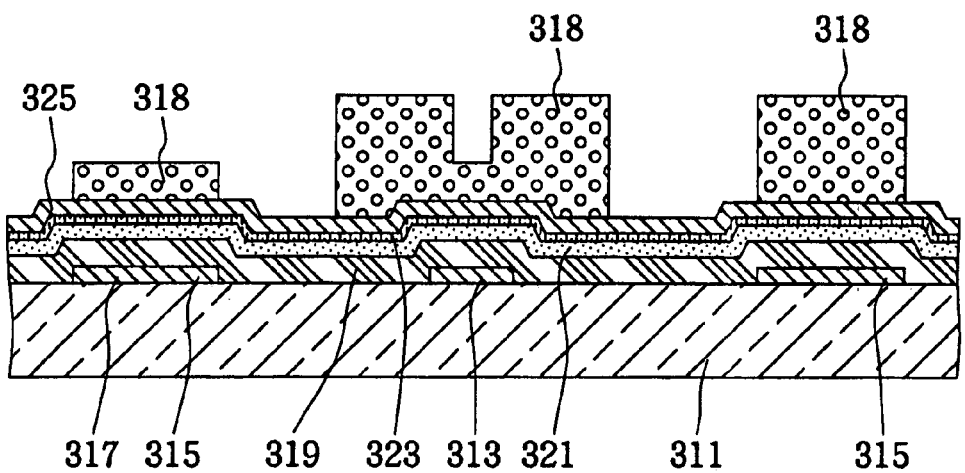
Figure 4C:
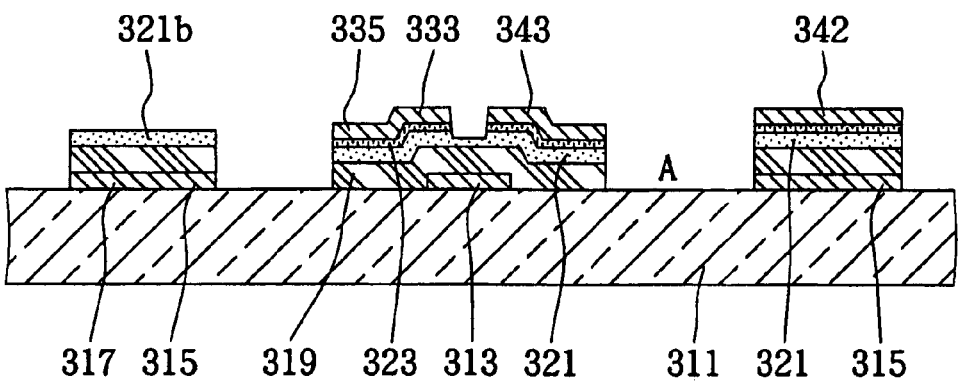

Then, a photoresist layer 318 is laid on the second conductive layer 325. The exposure step and the etching step of the photo-lithography process 2 (PEP2) are carried out, using a half-tone mask or a slit pattern, as shown in FIG. 4(b) and FIG. 4(c). As regards the half-tone mask, its substrate is made from transparent quartz. A chromium layer is affixed to the transparent quartz. A plurality of tiny windows, which seemingly have a grayscale effect, are disposed in parts of the mask pattern on the chromium layer. The layout of the binary tiny windows allows exposure intensity to be altered, and the step-shaped photoresist layer 318 is formed after exposure. The portion of the photoresist layer 318 within the aperture areas is fully exposed, but the portion of the photoresist layer 318 lying on the gate pads 317 and the gate electrodes 313 is not exposed to its full depth. As a result, the photoresist pattern formed varies in thickness. Furthermore, that thickness of the photoresist layer lying on the gate pads 317 is same as that thickness lying on the gate electrode 313.

The portion of the second conductive layer 325 that is exposed out of the photoresist layer 318 shown in FIG. 4(b) is removed by the etching step first. The doped semiconductor layer 323, and a portion of the semiconductor layer 321, which are exposed in sequence, are removed by etching. The photoresist layer 318 is removed to a certain depth in order to expose the second conductive layer 325 lying on the gate pads 317 and the gate electrodes 313. The exposed portion of the second conductive layer 325 is removed by the etching step, whereas the source electrodes 333 and the drain electrodes 343 have already been formed by this point. Lastly, the doped semiconductor layer 323 lying on the gate pads 317 and the gate electrodes 313 is also removed by the etching step, and the etching step stops after the semiconductor layer 321 appears. As shown in FIG. 4(c), the combination of data lines characterized by a default pattern and a structure has been completely formed, and it comprises the source electrodes 333, the drain electrodes 343, the data lines 335 and the storage capacitor electrodes 342. Excepted that, the thicknesses the semiconductor layer 321 over the gate electrode 313 and gate pad 317 are the same.

Figure 4D:
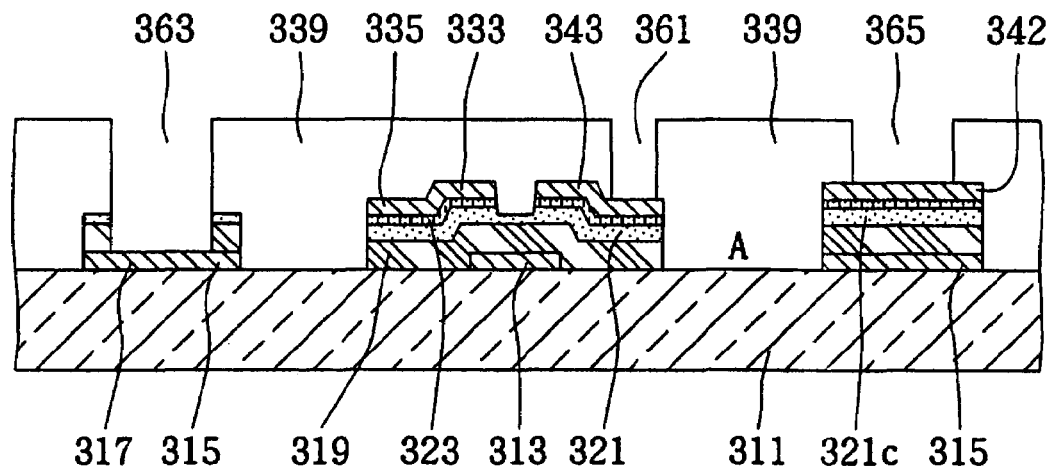

Then, an organic passivation layer 339 is deposited on the above-mentioned structure, and the photo-lithography process 3 (PEP3) is carried out to define, on the organic passivation layer 339, the holes 361, 363 and 365 that function as the contact channels for the combination of the data lines and the transparent conductive layer, as shown in FIG. 4(d). Since the gate insulating layer 319 and the semiconductor layer 321 disposed on the gate pads 317 are not covered with the second conductive layer 325, it is feasible to expose the gate pads 317 by a dry etching step.

Figure 4E:
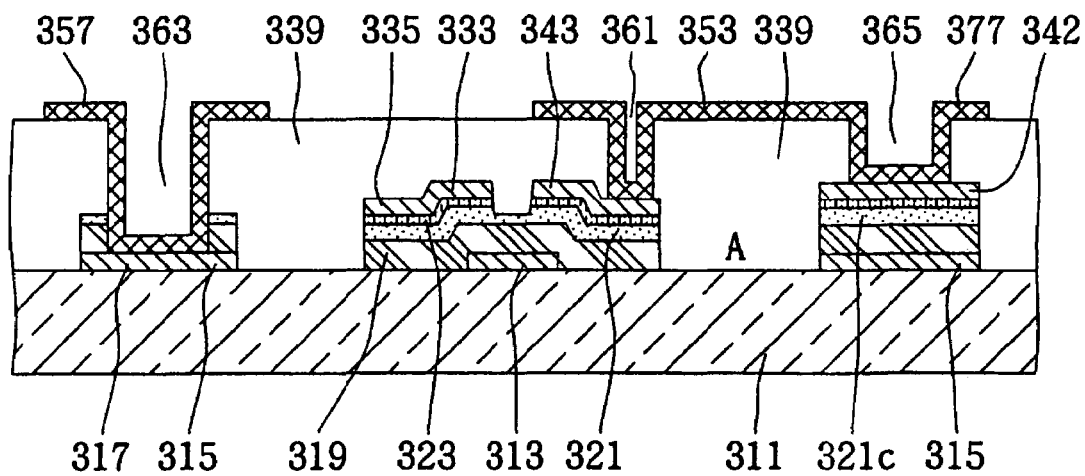

As shown in FIG. 4(e), during the photo-lithography process 4 (PEP4), a transparent conductive layer is deposited on the surface of the organic passivation layer 339 and in the holes 361, 363 and 365, whereas the patterns of the pixel electrodes 353, the gate pad terminals 357 and the storage capacitor electrodes 377 are respectively defined.

The Back Channel Etch (BCE) structure shown in FIG. 4(e) is fabricated by means of the four photo-lithography processes in accordance with the present invention. However, with conventional skills, the same structure can be produced only by at least five photo-lithography processes. Hence, the present invention does decrease the manufacturing processes and enhance the competitiveness of the products.

To minimize the effect impurities of the organic passivation layer 339 has on the electrical characteristics of the thin film transistors 314 in the situation where the semiconductor layer 321 of the thin film transistors 314 is in contact with the organic passivation layer 339, it is feasible to treat the surface of the semiconductor layer 321 with a mixture of plasma and nitrogen, hot oxygen or hot nitrogen in order to form a passivation layer.

Figure 5:
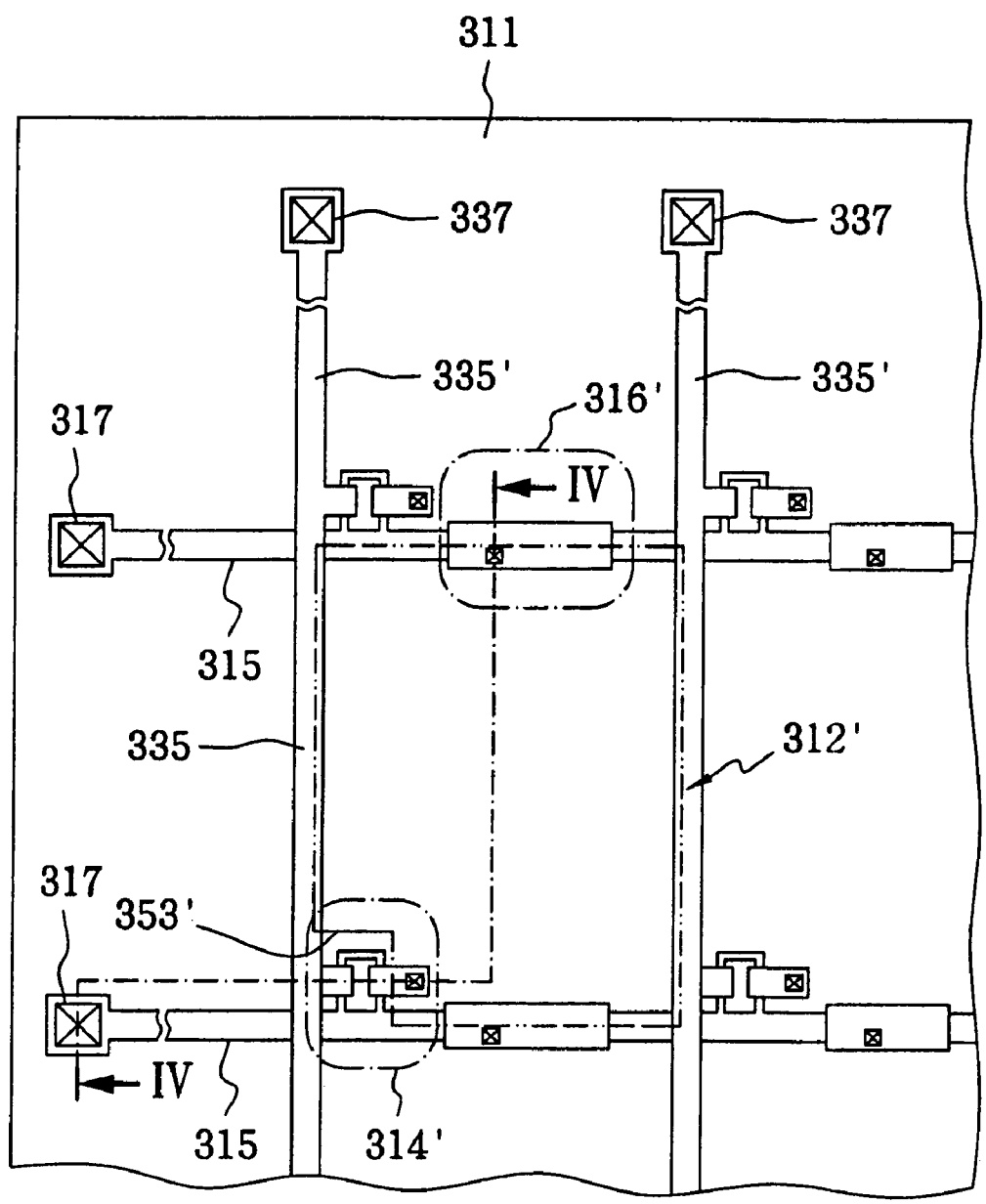
FIG. 5 is a schematic diagram of the partial circuit of an active substrate in accordance with the present invention.

FIG. 5 is a schematic diagram of the partial circuit of an active substrate in accordance with the present invention. On the substrate 311, there are a plurality of pixels 312' disposed at the intersections of the scanning lines 315 and the data lines 335'. Furthermore, a gate pad 317 is formed at one end of each scanning line 315. Various driving devices are connected to the gate pads 317 and the data pads 337. Inside each pixel 312' there is a thin film transistor 314' which is switched on or off through the scanning lines 315. Signal voltages of the data lines 335 may be written into the pixel electrodes 353'. To prevent the levels written into the pixel electrodes 353' from attenuating excessively with time, a storage capacitor 316' is formed either between a scanning line 315 and a pixel electrode 353' or between a scanning line 315 and a common electrode.

Figure 6A:
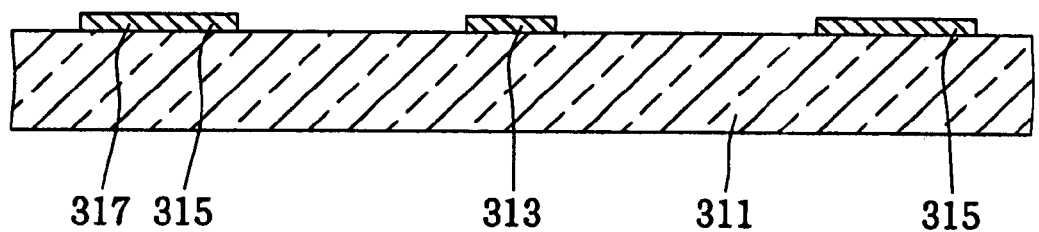
FIGS. 6(a)–6(e) are cross-sectional diagrams taken along the line IV—IV, regarding the steps of the manufacturing process for the cross-sectional structure depicted in FIG. 5.

FIGS. 6(a)–6(e) are cross-sectional diagrams taken along the line IV—IV, regarding the steps of the manufacturing process for the cross-sectional structure depicted in FIG. 5. The present embodiment is similar to the preceding embodiment as far as the photo-lithography process 1 (PEP1) is concerned, that is, a first conductive layer is formed on the substrate 311, and the photo-lithography process 1 (PEP1) is carried out to define the pattern of the first conductive layer which comprises a gate line combination composed of the gate pads 317, the scanning lines 315 and the gate electrodes 313, as shown in FIG. 6(a).

Figure 6B:
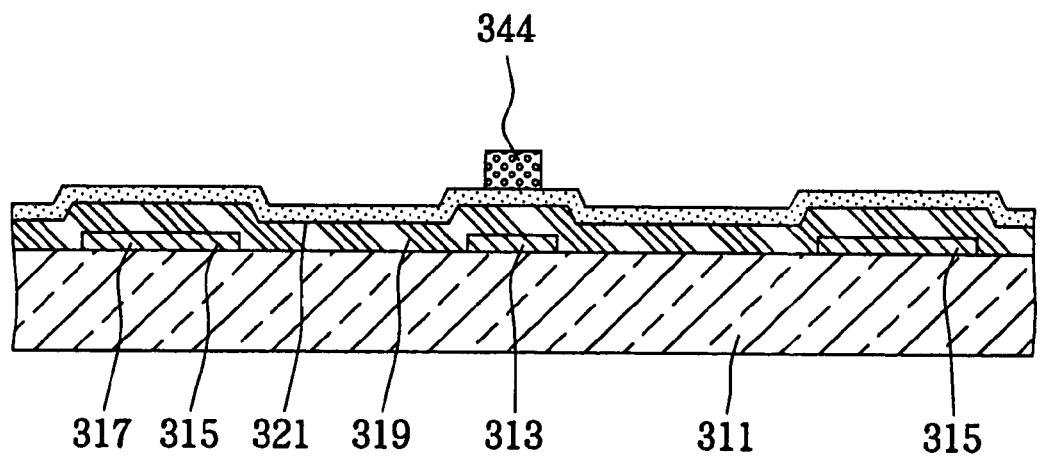

During the photo-lithography process 2 (PEP2), the gate insulating layer 319 and the semiconductor layer 321 are deposited on the substrate 311 and the gate line combination respectively, whereas an etching stop (ES) is defined above the gate electrodes 313, as shown in FIG. 6(b). The etching stop 344, which appears in the form of a silicon nitride film, prevents the semiconductor layer 321 disposed on the gate electrodes 313 from being partly etched and therefore avoids reduction of consistency in the width of the channels for the transistors. Hence, the aforesaid etching stop or channel protection technique is sometimes applied to the manufacturing of the liquid crystal displays nowadays.

Figure 6C:
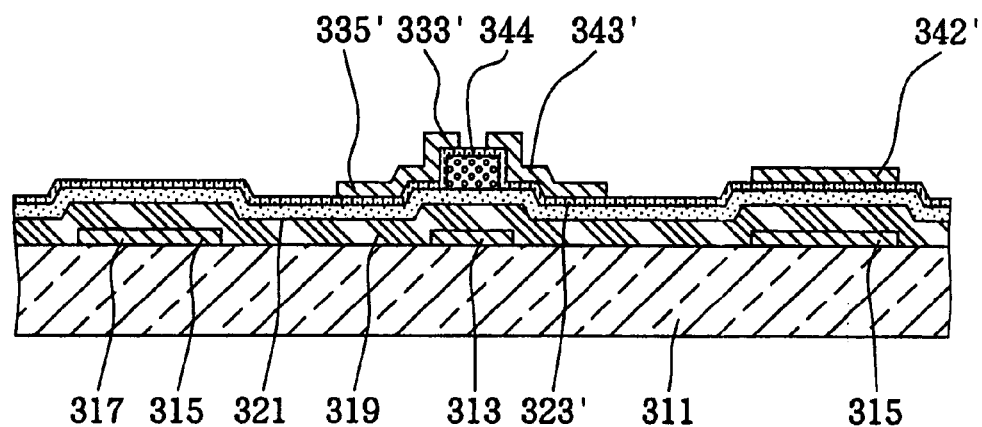

After the etching stop 344 was defined, the photo-lithography process 3 (PEP3) is carried out to deposit the doped semiconductor layer 323' and the second conductive layer on the semiconductor layer 321 and the etching stop 344 respectively, and the pattern of the second conductive layer is defined by etching in order to form the data line combination composed of the source electrodes 333', the drain electrodes 343', the data lines 335' and the storage capacitor electrodes 342', as shown in FIG. 6(c).

Figure 6D:
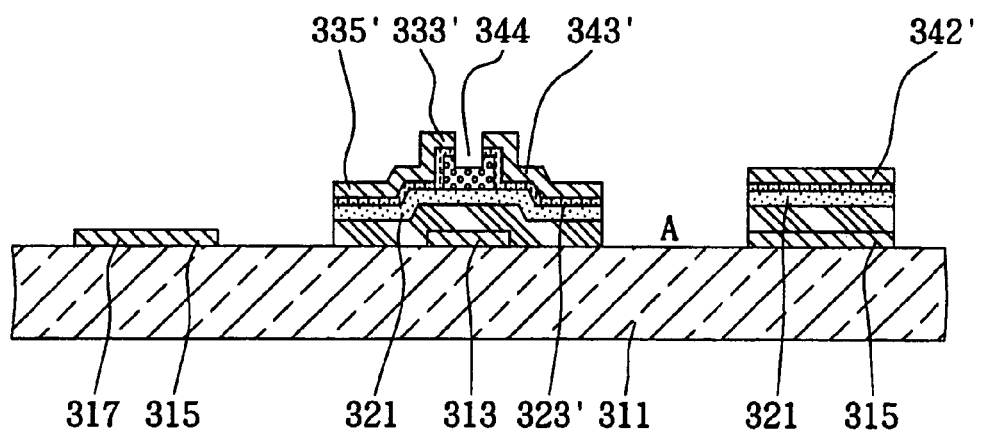
Figure 6E:
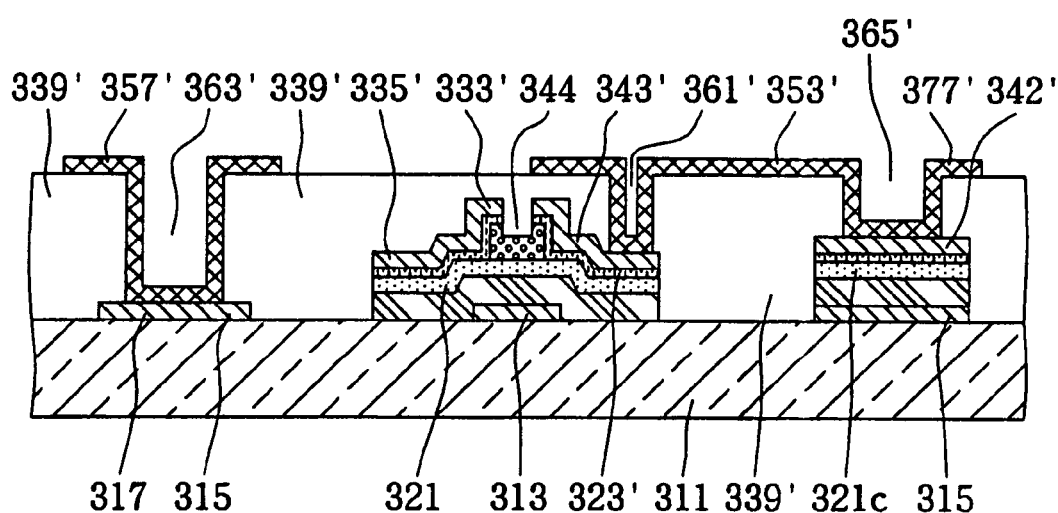

The gate insulating layer 319, the semiconductor layer 321 and the doped semiconductor layer 323' disposed on the gate pads 317 and within the aperture areas are removed during a succeeding etching step as they are not covered by the second metallic layer. However, parts of them that are not susceptible to etching remain around the gate electrodes 313 to a certain depth because the thickness of the etching stop 344 is greater than the sum of the thickness of the gate insulating layer 319 and the thickness of the semiconductor layer 321, as shown in FIG. 6(d).

Then, an organic passivation layer 339' is deposited on the transparent substrate and the above-mentioned structure, and the photo-lithography process 4 (PEP4) is carried out to define, on the organic passivation layer 339', the holes 361', 363' and 365', which are to function as the contact channels for the data line combination and the transparent electrical conduction layer.

Lastly, during the photo-lithography process 5 (PEP5), a transparent conductive layer is deposited on the surface of the passivation layer 339' and inside the holes 361', 363' and 365', and the pattern of the pixel electrodes 353', the gate pad terminals 357' and the storage capacitor electrodes 377' are defined respectively.

If it is not necessary to give consideration to the fact that the thickness of the etching stop 344 is greater than the sum of the thickness of the gate insulating layer 319 and the thickness of the semiconductor layer 321, the present invention provides a method of manufacturing a liquid crystal display equipped with an etching stop structure, as shown in FIGS. 7(a)–7(f). Although the manufacturing method has one more photo-lithography process, compared to the preceding manufacturing method illustrated with FIGS. 6(a)–6(e), the control over the results of its etching steps is easier and thus the stability of the manufacturing process is enhanced.

Figure 7A:
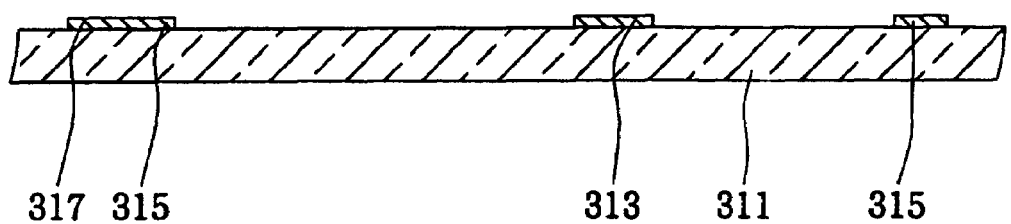
FIGS. 7(a)–7(f) are schematic diagrams about the steps of the manufacturing process in accordance with another embodiment of the present invention.

A first conductive layer is formed on the substrate 311, and the photo-lithography process 1 (PEP1) is carried out to define the patterns of the first conductive layer which comprises a gate complex composed of the gate pads 317, the scanning lines 315 and the gate electrodes 313, as shown in FIG. 7(a).

Figure 7B:
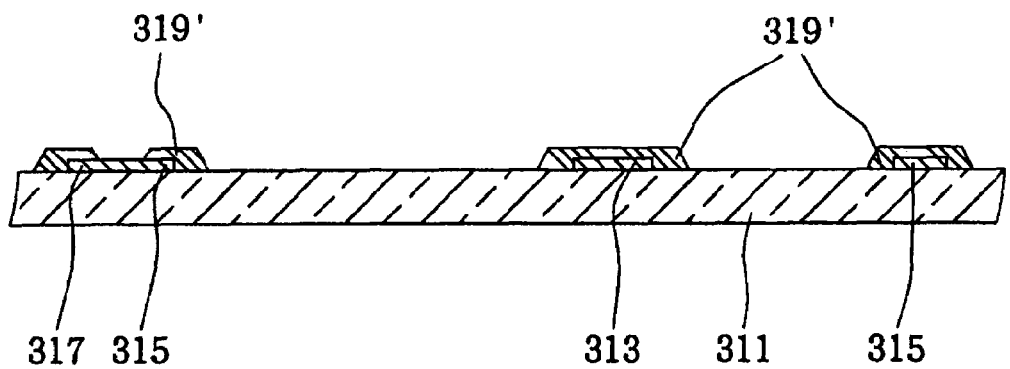

During the photo-lithography process 2 (PEP2), the gate insulating layer 319' is deposited on the substrate 311 and the gate complex respectively, whereas the portion of the gate insulating layer 319' lying on the gate pads 317 and within the aperture areas is removed by etching, as shown in FIG. 7(b).

Figure 7C:
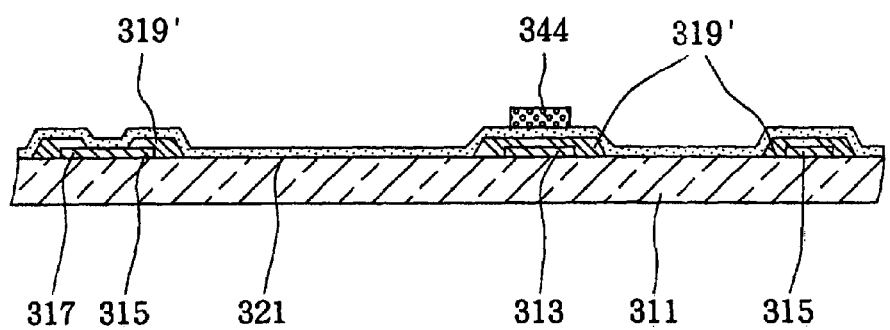

During the photo-lithography process 3 (PEP3), the semiconductor layer 321 is deposited on the substrate 311, the gate pads 317 and the gate insulating layer 319', whereas an etching stop 344 is formed above the gate electrodes 313 by etching, as shown in FIG. 7(c).

Figure 7D:
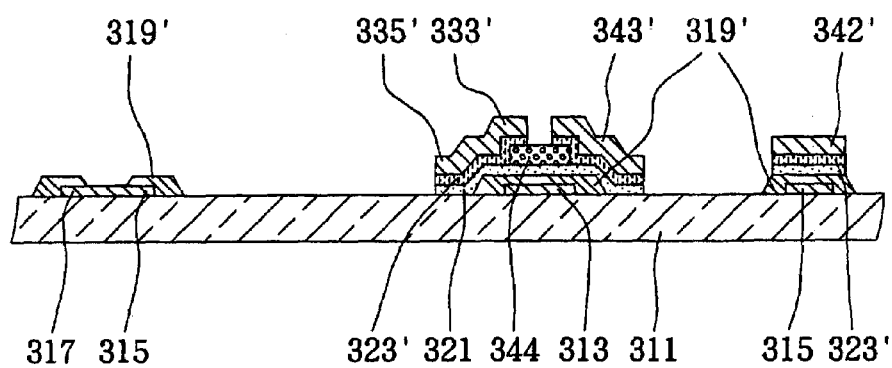

After the etching stop 344 was defined, the photo-lithography process 4 (PEP4) is carried out, during which the doped semiconductor layer 323' and the second conductive layer are deposited on the semiconductor layer 321 and the etching stop 344, respectively, whereas the pattern of the data line combination composed of the source electrodes 333', the drain electrodes 343', the data lines 335' and the storage capacitor electrodes 342' is defined on the second conductive layer by etching, as shown in FIG. 7(d). The semiconductor layer 321 and the doped semiconductor layer 323' disposed on the gate pads 317 and within the aperture areas are removed during a succeeding etching step, as they are not covered with the second metallic layer.

Figure 7E:
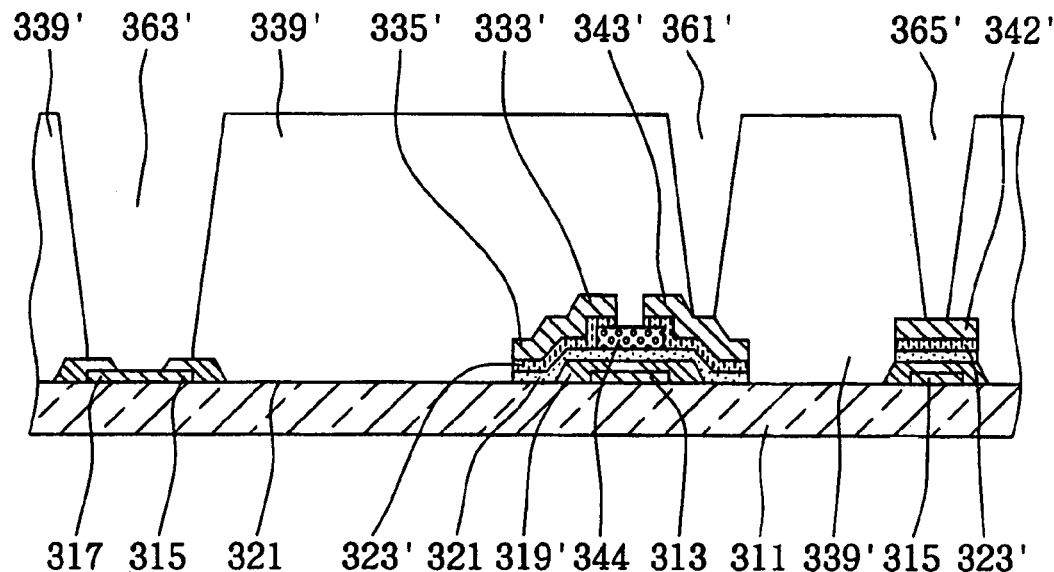

As shown in FIG. 7(e), an organic passivation layer 339' is deposited on the transparent substrate and the above-mentioned structure, and the photo-lithography process 5 (PEP5) is carried out to define, on the organic passivation layer 339', the holes 361', 363' and 365', which function as the contact channels for the data line combination and the transparent conductive layer.

Lastly, during -the photo-lithography process 6 (PEP6), a transparent electrical conduction layer is deposited on the surface of the passivation layer 339' and inside the holes 361', 363' and 365', and the patterns of the lo pixel electrodes 353', the gate pad terminals 357" and the storage capacitor electrodes 377" are defined respectively.

Figure 7F:
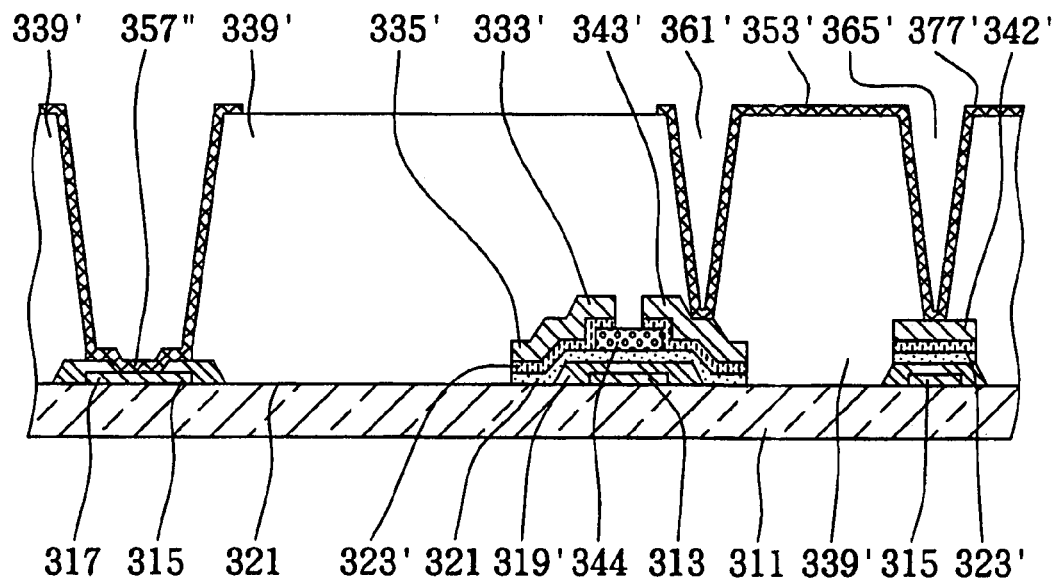
Figure 8:
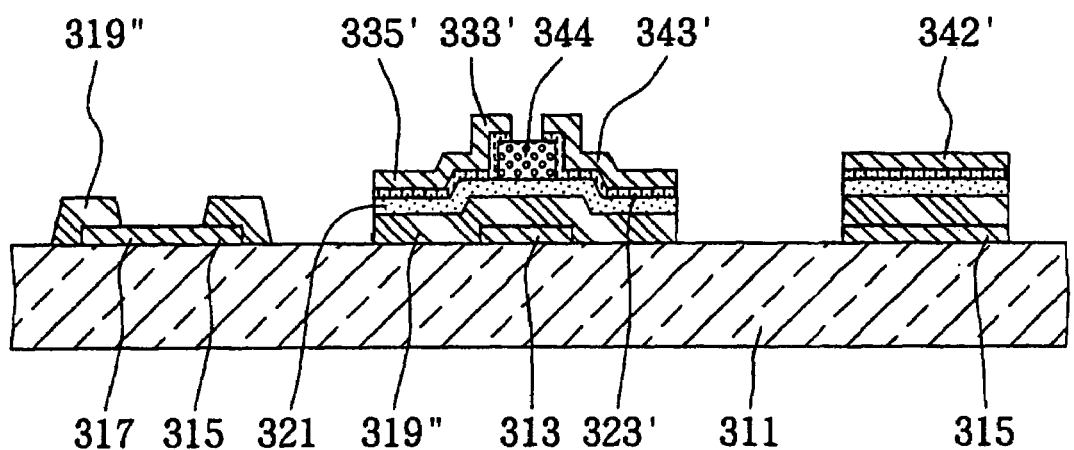
FIG. 8 is a schematic diagram about the step of the manufacturing process in accordance with another embodiment of the present invention.

In addition, the present invention provides a method of manufacturing a liquid crystal display equipped with an etching stop structure. As regards the manufacturing method, the photo-lithography process 1 (PEP1) through the photo-lithography process 3 (PEP3) are shown in FIG. 6(a) through FIG. 6(c) and thus they are not explained herein again. However, the manufacturing method is designed in such a way that the semiconductor layer 321 and the doped semiconductor layer 323' disposed on the gate pads 317 and within the aperture areas are removed after the data line combination composed of the source electrodes 333', the drain electrodes 343', the data lines 335' and the storage capacitor electrodes 342' was defined. Afterward, the photo-lithography process 4 (PEP4) is carried out to remove the portion of the gate insulating layer 319" lying within the aperture areas, and the holes are formed to expose the gate pads 317 beneath, as shown in FIG. 8. Then the photo-lithography process 5 (PEP5) and the photo-lithography process 6 (PEP6) are carried out in sequence, as shown in the steps disclosed in FIG. 7(e) through FIG. 7(f), thus they are not explained herein again. FIG. 7(f) shows the structure of the liquid crystal displays fabricated eventually.

The above-described embodiments of the present invention are intended to be illustrative only. Numerous alternative embodiments may be devised by persons skilled in the art without departing from the scope of the following claims.

What is claimed is:

1. A method of manufacturing a liquid crystal display, comprising the steps of:
    forming a first conductive layer on a substrate;
    patterning the first conductive layer to form a gate line with a gate line, a gate electrode and a gate pad;
    forming a gate insulating layer, a semiconductor layer, a doped semiconductor layer and a second conductive layer on the gate line;
    forming a photoresist pattern with various thicknesses on the second conductive layer, wherein said photoresist pattern is a layer unexposed in a certain thickness over said gate pad and said gate electrode;
    providing stepwise etching on said second conductive layer, said doped semiconductor layer, and a portion of said semiconductor layer so as to form a data line with source electrode and a drain electrode;
    forming an organic protection layer,
    patterning said organic protection layer to form a plurality of through holes; and
    forming a third conductive layer in said through holes electrically connected to said second conductive layer.

2. The method of manufacturing a liquid crystal display of claim 1, wherein the photoresist pattern with various thicknesses is formed by a halftone mask.

3. The method of manufacturing a liquid crystal display of claim 1, wherein the photoresist pattern with various thicknesses is formed by a mask with a slit pattern.

4. The method of manufacturing a liquid crystal display of claim 1, wherein the organic protection layer is made from benzocyclobutene (BCB), perfluorocyclobutane (PFCB), fluorinated para-xylene, acrylic resin, or color resin.

5. The method of manufacturing a liquid crystal display of claim 1, wherein all areas are etched to the substrate to stop except the areas of the gate line and data line.

6. The method of manufacturing a liquid crystal display of claim 1, further comprising a step of forming an inorganic protection layer on the semiconductor layer over the gate electrode.

7. The method of manufacturing a liquid crystal display of claim 6, wherein the inorganic protection layer is formed by treating the semiconductor layer with a mixture of plasma and nitrogen, hot oxygen or hot nitrogen.

8. The method of manufacturing a liquid crystal display of claim 1, further comprising a step of removing the gate insulating layer and semiconductor layer disposed on the gate pads so as to expose the gate pads.

9. A method of manufacturing a liquid crystal display, comprising the steps of: forming a first conductive layer on a substrate; patterning the first conductive layer to form a gate line with a gate line, a gate electrode and a gate pad; forming a gate insulating layer and a semiconductor layer on the gate line; forming an etching stop layer on the semiconductor layer and over the gate electrode; forming a doped semiconductor layer and a second conductive layer on the etching stop layer and semiconductor layer; patterning the second conductive layer, doped semiconductor layer, semiconductor layer and gate insulating layer to form a data line with a source electrode and a drain electrode; forming an organic protection layer; patterning the organic protection layer so as to form a plurality of through holes; forming a third conductive layer in the through holes electrically connected to the second conductive layer.

10. The method of manufacturing a liquid crystal display of claim 9, wherein the thickness of the etching stop layer is greater than the total thickness of the semiconductor layer and gate insulating layer.

11. The method of manufacturing a liquid crystal display of claim 9, further comprising a step of removing the gate insulating layer over the gate pad by a mask after the second conductive layer is patterned.

12. The method of manufacturing a liquid crystal display of claim 9, wherein the organic protection layer is made from benzocyclobutene (BCB), perfluorocyclobutane (PFCB), fluorinated para-xylene, acrylic resin, or color resin.

13. The method of manufacturing a liquid crystal display of claim 9, wherein all areas are etched to the substrate to stop except the areas of the gate line and data line.

14. A method of manufacturing a liquid crystal display, comprising the steps of: forming a first conductive layer on a substrate; patterning the first conductive layer to form a gate line with a gate line, a gate electrode and a gate pad; forming a gate insulating layer on the gate line and patterning the gate insulating layer for the gate pad to be exposed; forming a semiconductor layer, an etching stop layer, a doped semiconductor layer and a second conductive layer on the gate insulating layer and gate line; patterning the second conductive layer, doped semiconductor layer and semiconductor layer to form a data line, a source electrode and a drain electrode; forming an organic protection layer; patterning the organic protection layer to form a plurality of through holes; and forming a third conductive layer in the through holes electrically connected to the second conductive layer.

15. The method of manufacturing a liquid crystal display of claim 14, further comprising a step of removing the gate insulating layer except that over the gate line and data line after the gate insulating layer is formed.

16. The method of manufacturing a liquid crystal display of claim 14, wherein the gate line and gate electrode is covered with the gate insulating layer after the gate insulating layer is patterned.

17. The method of manufacturing a liquid crystal display of claim 14, wherein the organic protection layer is selected from a group consisting of benzocyclobutene (BCB), perfluorocyclobutane (PFCB), fluorinated para-xylene, acrylic resin, or color resin.

* * * * *